(12) United States Patent
Choi et al.

(10) Patent No.: US 9,484,557 B2
(45) Date of Patent: Nov. 1, 2016

(54) ORGANIC LIGHT-EMITTING DIODE (OLED) DISPLAY AND METHOD OF MANUFACTURING THE SAME

(71) Applicant: Samsung Display Co. Ltd., Yongin, Gyeonggi-do (KR)

(72) Inventors: Man Seob Choi, Hwaseong-si (KR); Min Woo Kim, Hwaseong-si (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 15/044,963

(22) Filed: Feb. 16, 2016

(65) Prior Publication Data
US 2016/0164049 A1 Jun. 9, 2016

Related U.S. Application Data

(62) Division of application No. 14/242,589, filed on Apr. 1, 2014, now Pat. No. 9,293,735.

(30) Foreign Application Priority Data

Jul. 3, 2013 (KR) ........................ 10-2013-0077830

(51) Int. Cl.
*H01L 27/32* (2006.01)
*H01L 51/56* (2006.01)
*H01L 51/52* (2006.01)

(52) U.S. Cl.
CPC ............ *H01L 51/56* (2013.01); *H01L 27/322* (2013.01); *H01L 51/5237* (2013.01);
(Continued)

(58) Field of Classification Search
CPC ........... H01L 27/3246; H01L 51/0005; H01L 27/3223; H01L 51/56; H01L 2251/5315; H01L 2251/55; H01L 2251/558; H01L 27/288; H01L 27/3211; H01L 27/3213; H01L 27/3218; H01L 27/322; H01L 33/08; H01L 33/01

USPC ....... 257/40, 88, E33.06, E33.064, E33.065, 257/E33.066, E33.072, E51.018, E51.019, 257/E51.022, 100, 103, 13, 89, 98, 99; 438/34, 35, 69
See application file for complete search history.

(56) References Cited

U.S. PATENT DOCUMENTS 8,624,275 B2 * 1/2014 Matsushima ....... H01L 27/3223
257/40
8,698,124 B2 * 4/2014 Shibata ................. H01L 33/145
257/13

(Continued)

FOREIGN PATENT DOCUMENTS

| KR | 10-2003-0030084 A | 4/2003 |
|---|---|---|
| KR | 10-0634011 B1 | 10/2006 |
| KR | 10-2009-0065104 A | 6/2009 |

*Primary Examiner* — William F Kraig
*Assistant Examiner* — Edward Chin
(74) *Attorney, Agent, or Firm* — Knobbe Martens Olson & Bear LLP

(57) ABSTRACT

An organic light-emitting diode (OLED) display and method of manufacturing the same are disclosed. In one aspect, the OLED display includes a substrate which includes non-emission regions and emission regions, a first electrode which is formed on each of the emission regions of the substrate, an organic light-emitting layer which is formed on the first electrode, a second electrode which is formed on the organic light-emitting layer and the substrate and a passivation layer which is formed on the second electrode. The passivation layer includes a first passivation layer which substantially overlaps the organic light-emitting layer and a second passivation layer which does not overlap the organic light-emitting layer, wherein the refractive index of the first passivation layer is higher than the refractive index of the second passivation layer.

12 Claims, 17 Drawing Sheets

(52) U.S. Cl.
CPC ...... *H01L 51/5246* (2013.01); *H01L 51/5253* (2013.01); *H01L 51/5275* (2013.01); *H01L 51/5284* (2013.01); *H01L 27/3246* (2013.01); *H01L 2227/323* (2013.01)

(56) References Cited

U.S. PATENT DOCUMENTS

| | | | |
|---|---|---|---|
| 8,729,580 B2* | 5/2014 | Lester | H01L 33/44 257/100 |
| 2004/0183436 A1* | 9/2004 | Ito | H01L 27/3246 313/506 |
| 2007/0145892 A1 | 6/2007 | Chen | |
| 2012/0138973 A1* | 6/2012 | Matsushima | H01L 27/3211 257/88 |
| 2013/0126839 A1* | 5/2013 | Matsushima | H01L 27/3246 257/40 |
| 2014/0070187 A1* | 3/2014 | Cho | H01L 51/52 257/40 |
| 2014/0183499 A1* | 7/2014 | Kim | H01L 27/3213 257/40 |
| 2014/0225087 A1* | 8/2014 | Fang | H01L 27/288 257/40 |
| 2015/0048316 A1* | 2/2015 | Choi | H01L 51/5284 257/40 |

* cited by examiner

ORGANIC LIGHT-EMITTING DIODE (OLED) DISPLAY AND METHOD OF MANUFACTURING THE SAME

CROSS-REFERENCE TO RELATED APPLICATIONS

This application is a divisional of U.S. application Ser. No. 14/242,589 filed on Apr. 1, 2014. U.S. application Ser. No. 14/242,589 claimed priority from Korean Patent Application No. 10-2013-0077830 filed on Jul. 3, 2013 in the Korean Intellectual Property Office, the disclosure of which is incorporated herein by reference in its entirety.

BACKGROUND

1. Field

The described technology generally relates to a display device and a method of manufacturing the same, and more particularly, to an organic light-emitting diode (OLED) display and a method of manufacturing the same.

2. Description of the Related Technology

The development of information and communications technology and the diversity of the information creates a continuously increasing demand for display devices. Display devices include cathode ray tubes (CRTs) and liquid crystal displays (LCDs). In particular, organic light-emitting diode (OLED) displays are unique due to their exceptional characteristics.

Unlike LCDs, OLED displays do not require a light source since OLEDs are self-emissive. Therefore, OLED displays generally have reduced thickness and weight. Additionally, OLED displays have a wide viewing angle, low power consumption, high luminance and high response speed. Due to these advantages, OLED displays are being actively developed as next-generation displays.

SUMMARY OF CERTAIN INVENTIVE ASPECTS

One inventive aspect is an organic light-emitting diode (OLED) display (hereinafter to be interchangeably used with "OLED display device") which includes a filler structure having improved light-emission efficiency.

Another aspect is a method of manufacturing an OLED display which includes a filler structure having improved light-emission efficiency.

Another aspect is an OLED display comprising a substrate which comprises non-emission regions and emission regions, a first electrode which is formed on each of the emission regions of the substrate, an organic light-emitting layer which is formed on the first electrode, a second electrode which is formed on the organic light-emitting layer and the substrate, and a passivation layer which is formed on the second electrode, wherein the passivation layer comprises a first passivation layer which substantially overlaps the organic light-emitting layer and a second passivation layer which does not overlap the organic light-emitting layer, wherein a refractive index of the first passivation layer is higher than a refractive index of the second passivation layer.

Another aspect is a method of manufacturing an OLED display, the method comprising preparing a first substrate which comprises an organic light-emitting layer and a second substrate which seals the first substrate, placing filler between the first substrate and the second substrate, bonding the first substrate and the second substrate together and forming a first passivation layer which overlaps the organic light-emitting layer and a second passivation layer which does not overlap the organic light-emitting layer, wherein a refractive index of the first passivation layer is higher than a refractive index of the second passivation layer.

Another aspect is a method of manufacturing an OLED display, the method comprising preparing a first substrate which comprises an organic light-emitting layer and a second substrate which seals the first substrate, forming a second passivation layer, which does not overlap the organic light-emitting layer, on the first substrate, spreading filler between the second passivation layer and another second passivation layer and bonding the first substrate and the second substrate together and forming a first passivation layer by curing the filler, wherein a refractive index of the first passivation layer is higher than a refractive index of the second passivation layer.

BRIEF DESCRIPTION OF THE DRAWINGS

The above described and other aspects and features of the described technology will become more apparent by describing in detail exemplary embodiments thereof with reference to the attached drawings.

DETAILED DESCRIPTION OF CERTAIN INVENTIVE EMBODIMENTS

Figure 1:
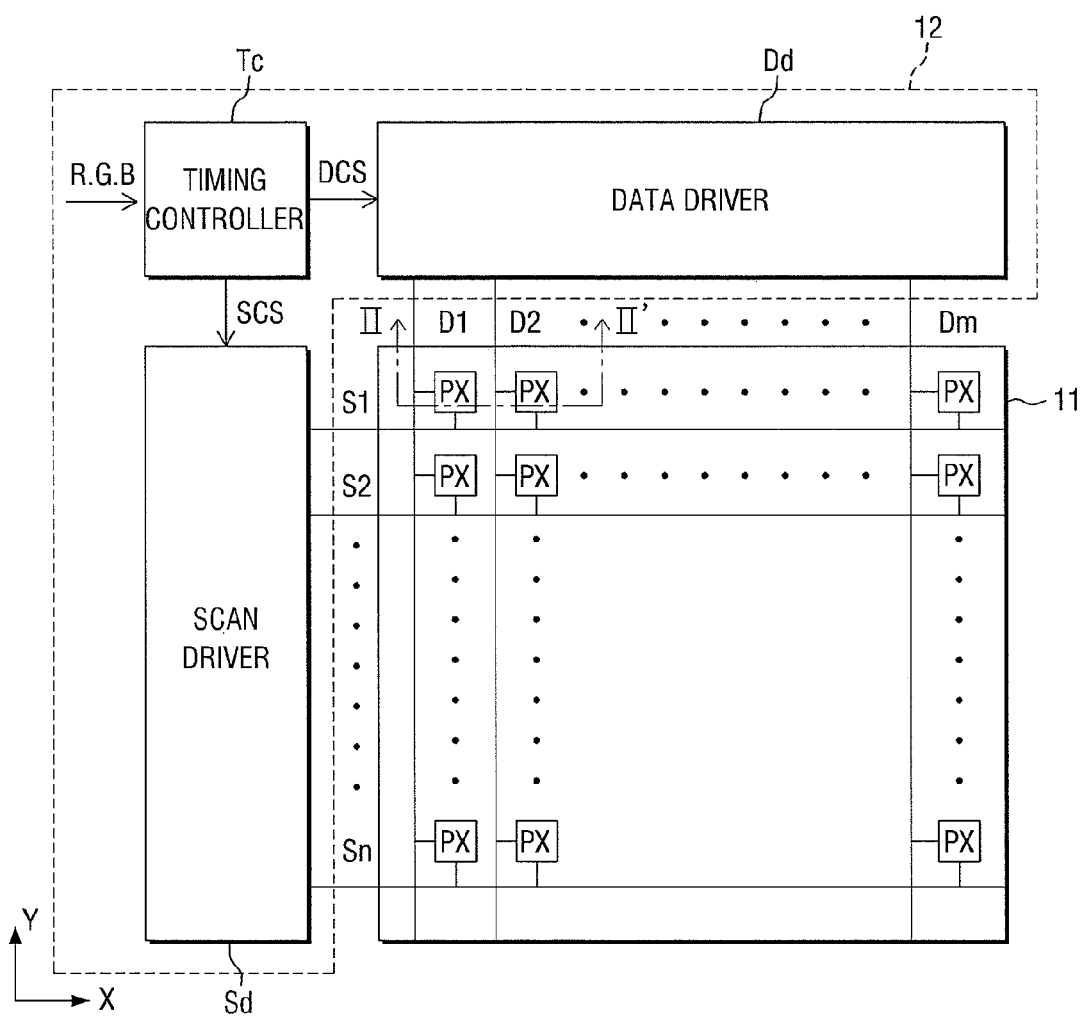
FIG. 1 is a block diagram of an OLED display according to an embodiment.

OLED displays generally include a thin-film transistor and an OLED for each of many pixels formed on a substrate and are sealed with a sealing member such as glass frit, for example. The sealing member can prevent penetration of moisture and foreign matter into each OLED and thin-film transistor. In addition, filler is typically interposed between the sealing member and the substrate. The filler can protect the OLED by absorbing external impact and can cool the OLED by absorbing heat emitted from the OLED. However, the filler can absorb part of the light emitted by the OLED, thereby reducing the light-emission efficiency of the OLED display.

Advantages and features of the described technology and methods of accomplishing the same may be understood more readily by reference to the following detailed description of preferred embodiments and the accompanying drawings. The described technology may, however, be embodied in many different forms and should not be construed as being limited to the embodiments set forth herein. Rather, these embodiments are provided so that this disclosure will be thorough and complete and will fully convey the concept of the described technology to those skilled in the art, and the described technology will only be defined by the appended claims. Thus, in some embodiments, well-known structures and devices are not shown in order not to obscure the description of the described technology with unnecessary detail. Like numbers refer to like elements throughout. In the drawings, the thickness of layers and regions may be exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items. Throughout the specification, the term "connected" includes "electrically connected."

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Hereinafter, embodiments of the described technology will be described in detail with reference to the attached drawings.

FIG. 1 is a block diagram of an OLED display 10 according to an embodiment of the described technology.

Referring to FIG. 1, the OLED display 10 may include a driving unit 12 and a panel 11. The driving unit 12 may include a timing controller Tc, a scan driver Sd, and a data driver Dd. The timing controller Tc, the scan driver Sd and the data driver Dd may be formed as one integrated circuit (IC) or may respectively be formed as separate ICs. Alternatively, only some of them may be combined into one IC.

The timing controller Tc may receive image data R, G, B and generate a scan driver control signal SCS and a data driver control signal DCS which correspond to the received image data R, G, B.

The scan driver Sd may receive the scan driver control signal SCS and generate first through $n^{th}$ scan signals S1 through Sn corresponding to the received scan driver control signal SCS. Each of the first through $n^{th}$ scan signals S1 through Sn may have an electric potential of a scan-on voltage or a scan-off voltage. The first through $n^{th}$ scan signals S1 through Sn may sequentially have the electric potential of the scan-on voltage. When the first through $n^{th}$ scan signals S1 through Sn have the electric potential of the scan-on voltage, first through $m^{th}$ data signals D1 through Dm may be transmitted to a plurality of pixels PX.

The data driver Dd may receive the data driver control signal DCS and generate the first through $m^{th}$ data signals D1 through Dm corresponding to the received data driver control signal DCS. The first through $m^{th}$ data signals D1 through Dm may be generated to be synchronized with the first through $n^{th}$ scan signals S1 through Sn. The first through $m^{th}$ data signals D1 through Dm may include information about the grayscale of an image displayed on the panel 11.

The panel 11 may include pixels PX. The pixels PX may be arranged in a substantially matrix pattern. However, the arrangement of the pixels PX is not limited to a matrix pattern. The pixels PX may be controlled differently and may emit light differently to display an image on the whole surface of the panel 11. Each of the pixels PX may include an organic light-emitting layer EL and a thin-film transistor TR. The organic light-emitting layer EL may emit light by itself. The thin-film transistor TR may drive the organic light-emitting layer EL and control the luminance of the organic light-emitting layer EL. The thin-film transistor TR may control a pixel PX to receive or not receive a data signal in response to the scan-on voltage of a scan signal, thereby controlling the luminance of the organic light-emitting layer EL.

Figure 2:
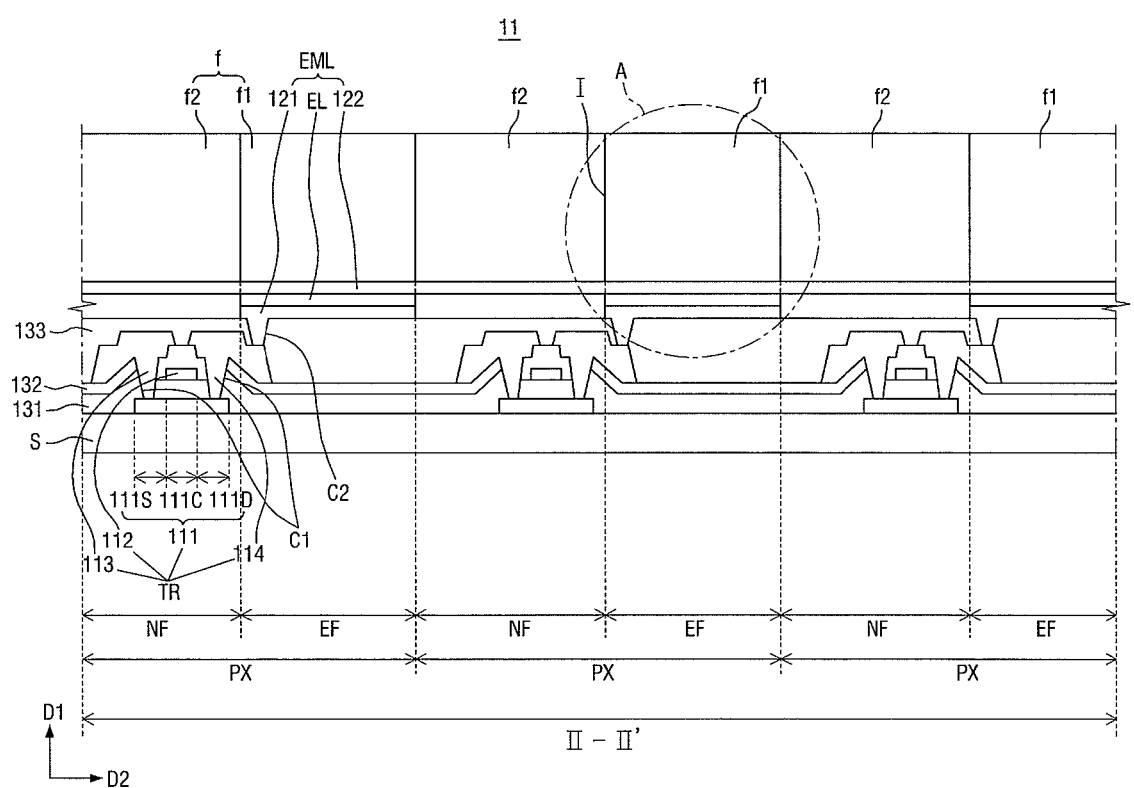
FIG. 2 is a cross-sectional view of a panel taken along the line II-II' of FIG. 1.

The structure of the panel 11 of the OLED display 10 will now be described in greater detail with reference to FIG. 2. FIG. 2 is a cross-sectional view of the panel 11 of the OLED display 10, taken along the line II-II' of FIG. 1.

Referring to FIG. 2, the panel 11 includes a substrate S, a first electrode 121, the organic light-emitting layer EL, a second electrode 122, and a passivation layer f.

The substrate S may be shaped like a substantially flat plate. The substrate S may be formed of an insulating material. In an example, the substrate S may be formed of glass, quartz, ceramic or plastic. According to some embodiments, the substrate S may be formed of a material that can be easily bent by an external force.

In some embodiments, the substrate S may further include a buffer layer which is formed on the substrate S to substantially prevent diffusion of impurity ions, substantially prevent penetration of moisture and outside air, and planarize the surface of the substrate S.

The substrate S may include the pixels PX. Each of the pixels PX may include a non-emission region NF and an emission region EF. That is, the substrate S may include a plurality of non-emission regions NF and a plurality of emission regions EF, and the emission regions EF and the non-emission regions NF may be arranged alternately. Here, each of the emission regions EF may be a region where the organic light-emitting layer EL is formed and light is emitted from the organic light-emitting layer EL. Each of the non-emission regions NF may be a region where the thin-film transistor TR driving the organic light-emitting layer EL is formed.

The thin-film transistor TR may include a semiconductor layer 111, a gate electrode 112, a source electrode 113, and a drain electrode 114.

The semiconductor layer 111 may be disposed on each of the non-emission regions NF. The semiconductor layer 111 may be formed of amorphous silicon or polysilicon. The semiconductor layer 111 may include a channel region 111C, a source region 111S, and a drain region 111D. The channel region 111C may be disposed between the source region 111S and the drain region 111D. The channel region 111C may be overlapped by the gate electrode 112. Depending on a voltage applied to the gate electrode 112, the channel region 111C may become conductive or non-conductive, thereby electrically connecting or insulating the source region 111S and the drain region 111D. A first insulating layer 131 may be formed on the semiconductor layer 111. The first insulating layer 131 may be formed of an inorganic material such as SiNx or SiOx, but is not limited thereto. According to some embodiments, the first insulating layer 131 may also be formed of an organic material.

The gate electrode 112 may be disposed on the first insulating layer 131 to be insulated from the semiconductor layer 111 and overlap the channel region 111C. The gate electrode 112 may be formed of a conductive material. Examples of the conductive material that forms the gate electrode 112 may include, but is not limited to, a transparent conductive material (such as indium tin oxide (ITO)), titanium (Ti), molybdenum (Mo), aluminum (Al), silver (Ag), copper (Cu) and alloys of these materials. A voltage applied to the first gate electrode 112 may control activation of the channel region 111C, and the thin-film transistor TR may be turned on or off according to the activation or deactivation of the channel region 111C.

A second insulating layer 132 may be formed on the gate electrode 112. The second insulating layer 132 may be formed of the same inorganic or organic material as the first insulating layer 131.

The source electrode 113 and the drain electrode 114 may be disposed on the second insulating layer 132. The source electrode 113 and the drain electrode 114 may contact the source region 111S and the drain region 111D through first contact holes C1, respectively. In response to the activation of the channel region 111C, an electric current may flow from the source electrode 113 to the drain electrode 114. Then, the drain electrode 114 may allow the electric current to flow to the first electrode 121 through a second contact hole C2. A third insulating layer 133 may be formed on the source electrode 113 and the drain electrode 114 to insulate and protect the source electrode 113 and the drain electrode 114. The third insulating layer 133 may be formed of the same inorganic or organic material as the first insulating layer 131.

The first electrode 121 may be formed on each of the emission regions EF of the substrate S, and the organic light-emitting layer EL may be formed on the first electrode 121. Therefore, respective cross-sectional areas of the first electrode 121 and the organic light-emitting layer EL may be substantially equal to a cross-sectional area of each of the emission regions EF. The second electrode 122 may be formed on the organic light-emitting layer EL and the substrate S. The first electrode 121, the organic light-emitting layer EL and the second electrode 122 may form an OLED EML. The OLED EML may be a top-emission device which emits light upward. That is, light emitted from the organic light-emitting layer EL may proceed in an upward direction D1 of the panel 11. However, the described technology is not limited thereto. According to some embodiments, the OLED EML may be a bottom-emission device, and light may proceed in an opposite direction to the upward direction D1 of the panel 11.

The first electrode 121 may be formed on the third insulating layer 133. The first electrode 121 may be connected to the drain electrode 114 of the thin-film transistor TR by the second contact hole C2. The first electrode 121 may be an anode of the OLED EML. The first electrode 121 may be formed of a reflective conductive material, a transparent conductive material, or a semi-transparent conductive material. Examples of the reflective conductive material include lithium (Li), calcium (Ca), lithium fluoride/calcium (LiF/Ca), lithium fluoride/aluminum (LiF/Al), Al, Ag, magnesium (Mg), and gold (Au). Examples of the transparent conductive material include ITO, indium zinc oxide (IZO), zinc oxide (ZnO), and indium oxide ($In_2O_3$). The semi-transparent conductive material may be a co-deposition material containing one or more of Mg and Ag or may be one or more of Mg, Ag, Ca, Li, and Al.

The organic light-emitting layer EL may be disposed on the first electrode 121. The organic light-emitting layer EL may emit light at a brightness level corresponding to an electric current flowing therethrough. Specifically, holes and electrons provided to the organic light-emitting layer EL may combine together to form excitons. When an energy level of the excitons changes from an excited state to a ground state, the organic light-emitting layer EL may emit light corresponding to the change in energy levels. The organic light-emitting layer EL in each of the pixels PX may emit light of one color. Depending on the organic material that forms the organic light-emitting layer EL, the organic light-emitting layer EL may emit red light, green light, or blue light.

The second electrode 122 may be disposed on the organic light-emitting layer EL. The second electrode 122 may be disposed on the whole surface of the panel 11 as illustrated in FIG. 2. However, the described technology is not limited thereto. The second electrode 122 may be a cathode of the organic light-emitting layer EL. The second electrode 122 may be formed thin using one or more of Mg, Ag, Ca, Li, and Al. Thus, the second electrode 122 may allow light generated from the organic light-emitting layer EL to travel upward from the organic light-emitting layer EL.

The passivation layer f may be formed on the second electrode 122. The passivation layer f may be transparent filler interposed between a sealing member (not shown) and the substrate S. The passivation layer f may absorb external impact and thus substantially prevent the external impact from being delivered to the thin-film transistor TR and the organic light-emitting layer EL on the substrate S. In addition, the passivation layer f may suppress internal heat by absorbing and cooling heat generated from the organic light-emitting layer EL. The passivation layer EL may include a first passivation layer f1 which overlaps the organic light-emitting layer EL and a second passivation layer f2 which does not overlap the organic light-emitting layer EL. The structures and characteristics of the first passivation layer f1 and the second passivation layer f2 will now be described in detail with reference to FIGS. 3 and 4.

Figure 3:
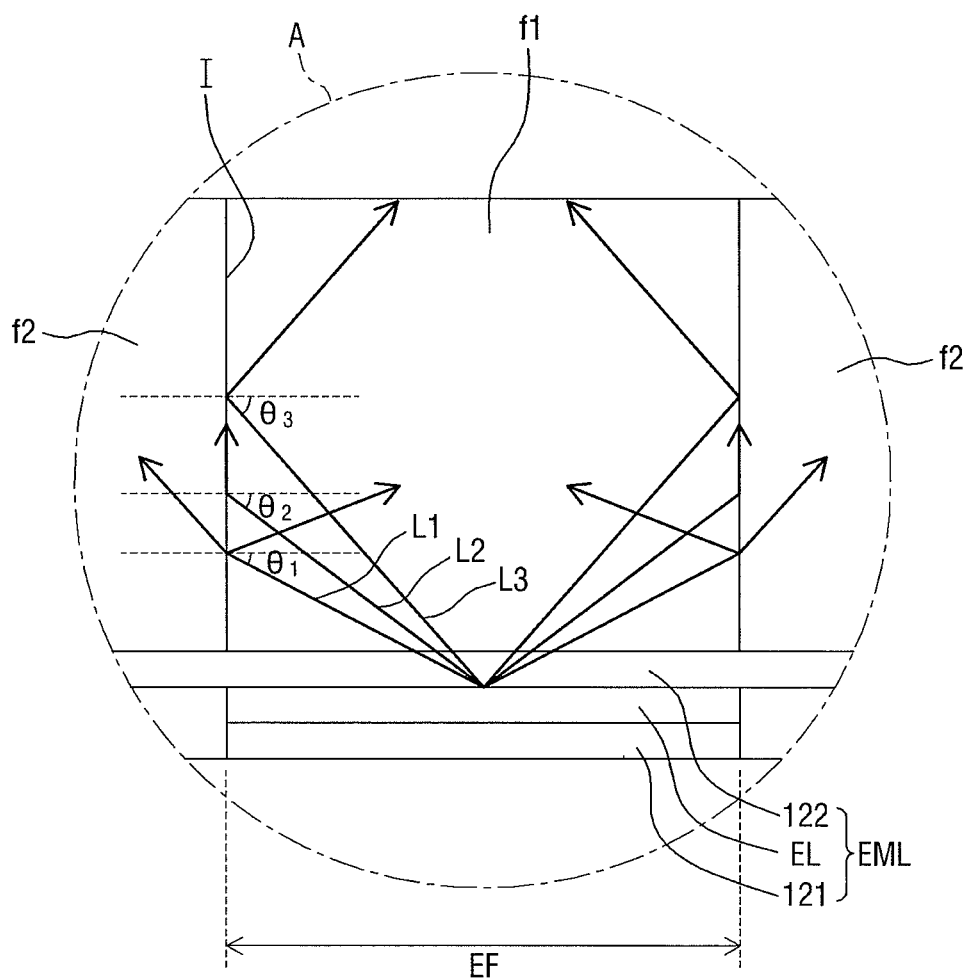
FIG. 3 is a cross-sectional view of a first passivation layer and a second passivation layer according to an embodiment.
Figure 4:
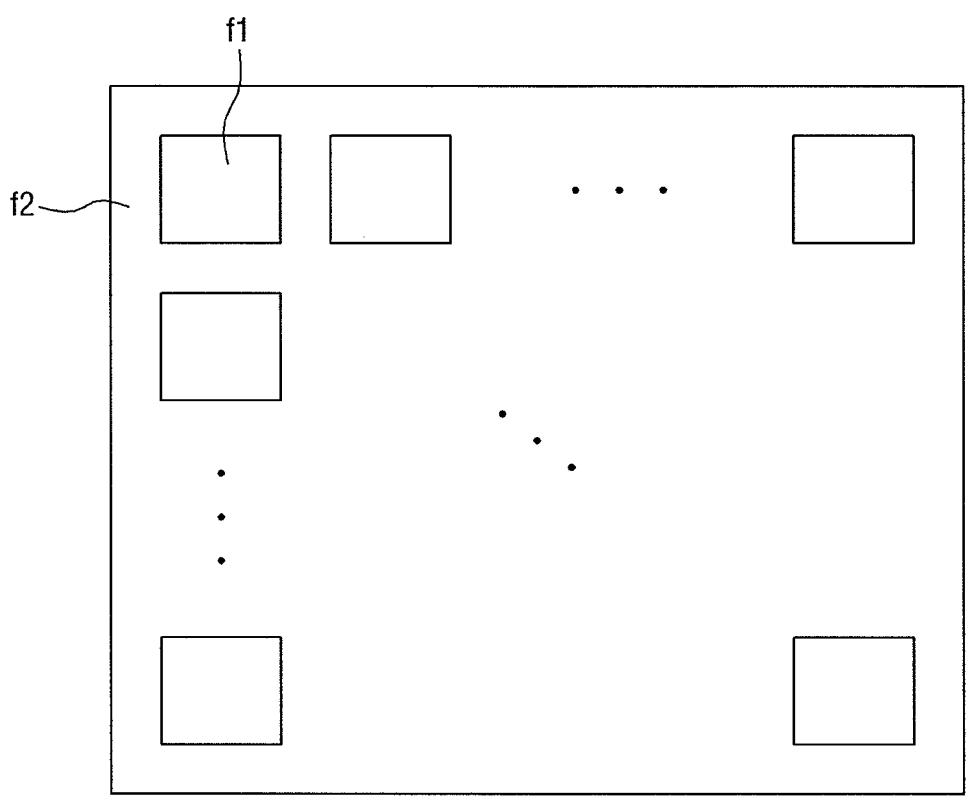
FIG. 4 is a plan view of the first passivation layer and the second passivation layer shown in FIG. 2.

FIG. 3 is a cross-sectional view of a first passivation layer f1 and a second passivation layer f2 according to an embodiment of the described technology. FIG. 4 is a plan view of the first passivation layer f1 and the second passivation layer f2 shown in FIG. 2. That is, FIG. 3 is an enlarged view of a region A, illustrating the relationship between the first passivation layer f1 and the second passivation layer f2, and FIG. 4 is a plan view of the panel 11 of FIG. 2 viewed from above.

Referring to FIGS. 3 and 4, since the first passivation layer f1 substantially overlaps the organic light-emitting layer EL, a cross-sectional area of the first passivation layer f1 may be substantially equal to the cross-sectional area of each of the emission regions EF. If the OLED EML is a top-emission type, the first passivation layer f1 may be the path light follows when emitted from the organic light-emitting layer EL. That is, the light may travel upward in the panel 11 and pass through the first passivation layer f1 to be emitted to the outside of the panel 11.

Since the second passivation layer f2 does not overlap the organic light-emitting layer EL, the first passivation layer f1 and the second passivation layer f2 may be arranged alternately when viewed in a plane view. In addition, when the panel 11 is viewed from above, the first passivation layers f1 may be arranged in a substantially matrix pattern in the second passivation layer f2. Since the second passivation layer f2 does not overlap the organic light-emitting layer EL, it is not a direct path for light to travel through. However, part of the emitted light can be diffused to the second passivation layer f2. That is, portions L1, L2 and L3 of light emitted from the organic light-emitting layer EL may not proceed directly upward in the panel 11 but may proceed toward the second passivation layer f2 after passing through the first passivation layer f1.

Here, the first passivation layer f1 may have a higher refractive index than the second passivation layer f2. The first passivation layer f1 may include a material having a high refractive index of about 1.6 or more. The high refractive material may be spread over the whole surface of the first passivation layer f1 so as to increase the overall refractive index of the first passivation layer f1 or may be provided at a boundary surface with the second passivation layer f2 so as to increase the refractive index of the first passivation layer f1 at the boundary surface. The second passivation layer f2 may include a material having a refractive index of less than about 1.6. The material having the refractive index of less than about 1.6 may be spread over the whole surface of the second passivation layer f2 so as to decrease the overall refractive index of the second passivation layer f2 or may be provided at the boundary surface with the first passivation layer f1 so as to decrease the refractive index of the second passivation layer f2 at the boundary surface.

The material having the high refractive index of about 1.6 or more may be high refractive curable polysilicon such as polydiaryl siloxane, methyltrimethoxysilane or tetramethoxysilane. The material having the refractive index of less than about 1.6 may be a low refractive ultraviolet-curable acrylate polymer such as ethylhexyl acrylate, pentafluoropropyl acrylate, poly(ethylene glycol)dimethacrylate or ethylene glycol dimethacrylate.

When light L1, L2 or L3 moves from a high refractive medium to a low refractive medium, it may be refracted to the low refractive medium or may be reflected to the high refractive medium according to the difference between refractive indices of the high and low refractive mediums. Therefore, the light L1, L2 or L3 travelling from the first passivation layer f1 having a high refractive index to the second passivation layer f2 having a low refractive index may be refracted to the second passivation layer f2 or may be reflected to the first passivation layer f1. The path of the light L1, L2 or L3 may be determined by an incidence angle $\theta_1$, $\theta_2$ or $\theta_3$ of the light L1, L2 or L3 incident upon a boundary surface I between the first passivation layer f1 and the second passivation layer f2. In an example, when the incidence angle $\theta_1$ is smaller than a critical angle $\theta_c$, a portion of the light L1 may be reflected at the boundary surface I, but another portion of the light L1 may proceed to the second passivation layer f2. Here, the critical angle $\theta_c$ may be determined by the refractive indices of the first passivation layer f1 and the second passivation layer f2. When the incidence angle $\theta_2$ is equal to the critical angle $\theta_c$, the light L2 may not be reflected nor refracted but may proceed along the boundary surface I. When the incidence angle $\theta_3$ is greater than the critical angle $\theta_c$, the incident light L3 may not be refracted to the second passivation layer f2 but may be totally reflected at the boundary surface I to proceed back into the first passivation layer f1. Here, as the amount of totally reflected light increases, more light can be concentrated to the first passivation layer f1.

The above-described structural or optical characteristics of the passivation layer f enable the passivation layer f to concentrate light in the first passivation layer f1 which corresponds to each of the emission regions EF. Therefore, the passivation layer f can provide an improved light-emission effect. Furthermore, the passivation layer f can substantially prevent color mixture between the pixels PX by minimizing the diffusion of light to the second passivation layer f2.

Figure 5:
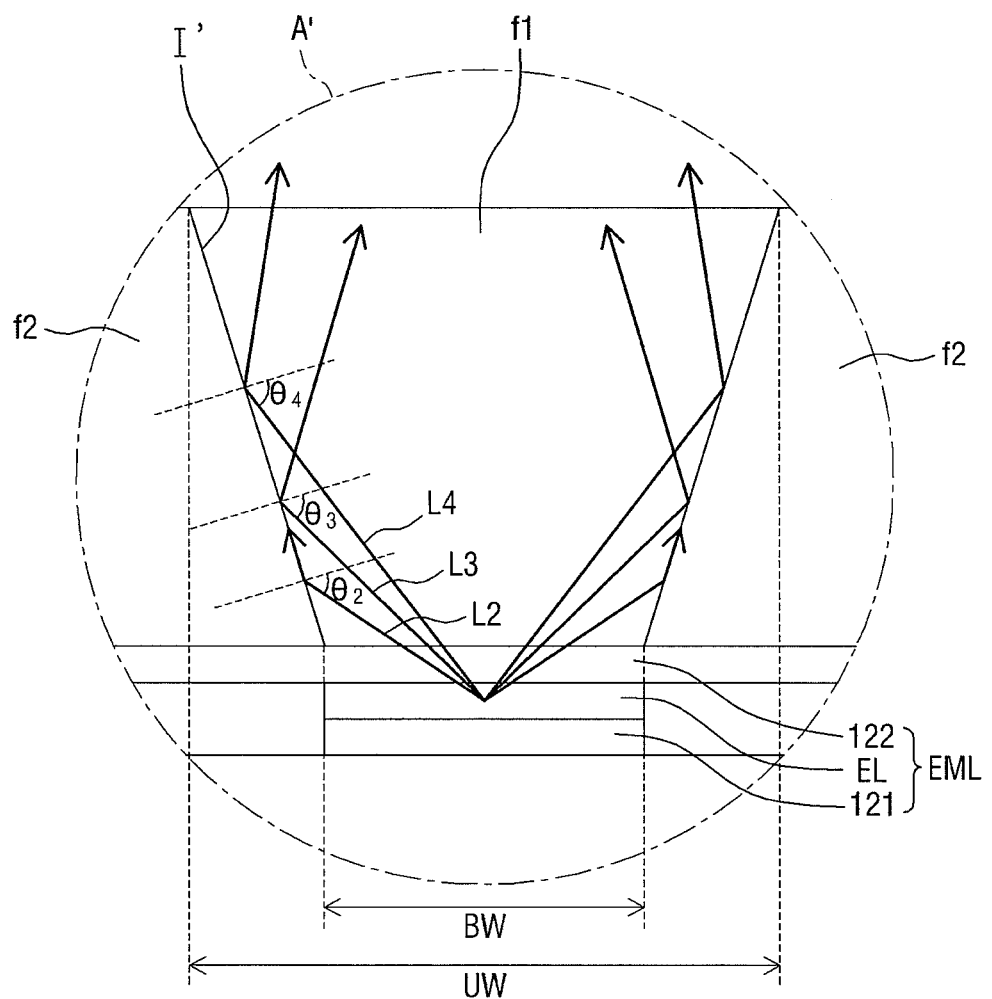
FIGS. 5 and 6 are cross-sectional views of a first passivation layer and a second passivation layer according to another embodiment.
Figure 6:
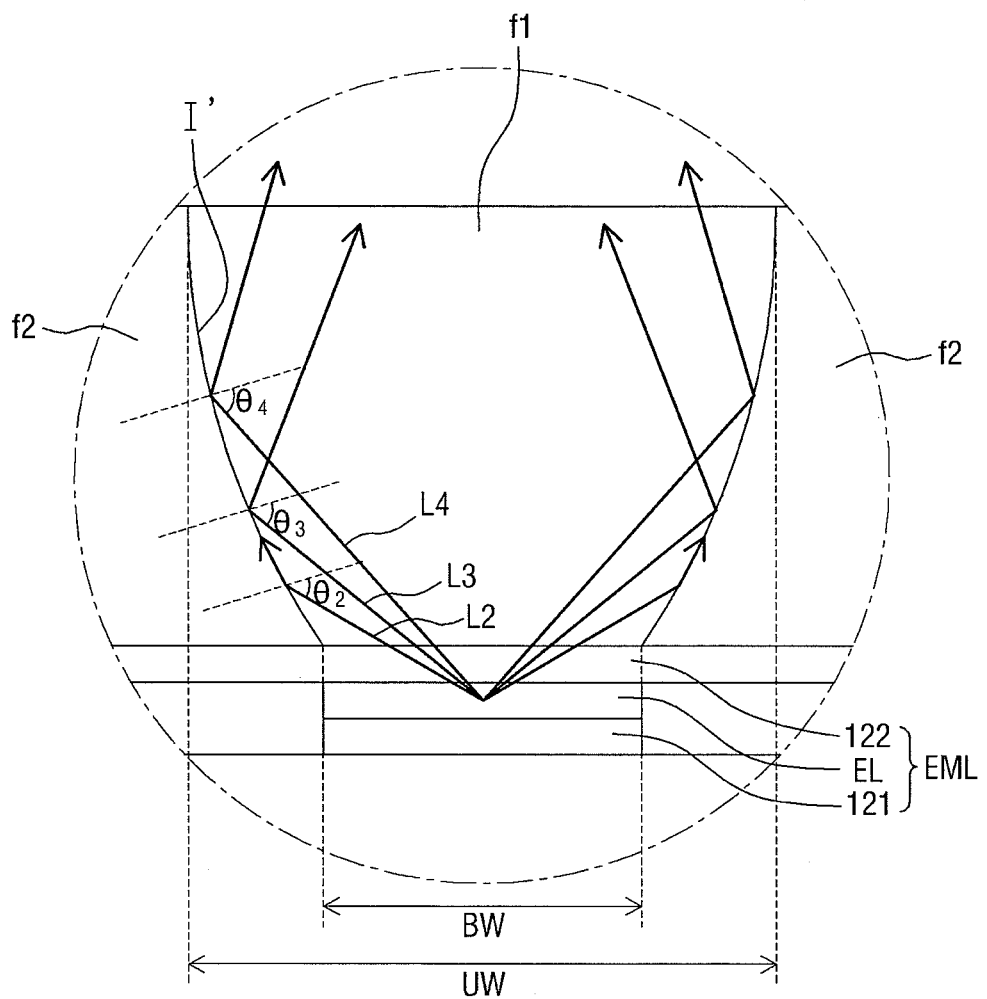

FIGS. 5 and 6 are cross-sectional views of a first passivation layer f1 and a second passivation layer f2 according to another embodiment.

Referring to FIGS. 5 and 6, a cross-sectional area UW of a top surface of the first passivation layer f1 may be greater than a cross-sectional area BW of a bottom surface of the first passivation layer f1. Here, the bottom surface may be a surface of the first passivation layer f1 which contacts the second electrode 122, and the top surface may be a surface of the first passivation layer f1 which is exposed to the outside of the OLED display 10. The cross-sectional area of the first passivation layer f1 may increase from the bottom surface of the first passivation layer f1 toward the top surface thereof. That is, referring to FIG. 5, a boundary surface I' between the first passivation layer f1 and the second passivation layer f2 may be an inclined surface with a predetermined slope. Alternatively, referring to FIG. 6, the boundary surface I' may be a curved inclined surface whose slope increases from the bottom surface of the first passivation layer f1 toward the top surface thereof. That is, a cross-section of the first passivation layer f1 may have an overhang structure with a reverse inclined surface and be shaped like a reverse trapezoid.

The boundary surface I' may cause more light rays to have greater incidence angles than a critical angle, as compared with the boundary surface I of FIG. 4. That is, since the boundary surface I' is inclined, light L3 or L4 having a greater incidence angle $\theta_3$ or $\theta_4$ may enter the boundary surface I'. Therefore, the light L3 or L4 may be totally reflected to be concentrated in the first passivation layer f1 which corresponds to each of the emission regions EF. That is, a passivation layer f according to the current embodiment can provide improved light-emission efficiency by maximizing the amount of light that is totally reflected in the first passivation layer f1 and minimizing the amount of light that is sent to the second passivation layer f2. Furthermore, the passivation layer f can substantially prevent color mixture between pixels.

Figure 7:
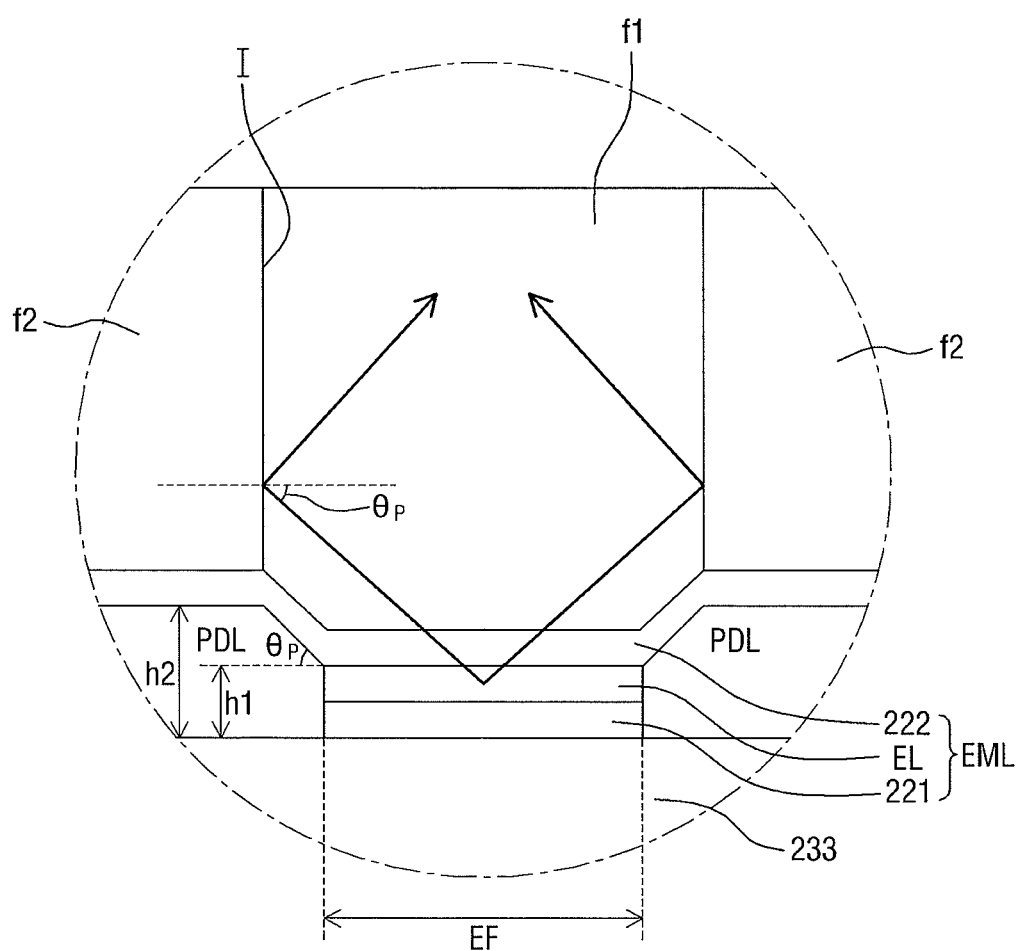
FIG. 7 is a cross-sectional view of a first passivation layer and a second passivation layer according to another embodiment.

FIG. 7 is a cross-sectional view of a first passivation layer f1 and a second passivation layer f2 according to another embodiment.

Referring to FIG. 7, the OLED display 10 may further include a pixel defining layer PDL. The pixel defining layer PDL may be disposed between the organic light-emitting layers EL. The pixel defining layer PDL may be formed of the same organic or inorganic material as the first insulating layer 131. The pixel defining layer PDL may be formed on a region of the third insulating layer 133 which corresponds to each of the non-emission regions NF, thereby defining each of the emission regions EF.

The pixel defining layer PDL may be formed at an angle to the organic light-emitting layer EL and may be stacked to a height h2 greater than a height h1 to which the organic light-emitting layer EL is stacked. That is, the pixel defining layer PDL may slope at a predetermined angle θp to the organic light-emitting layer EL. A portion of light emitted from the organic light-emitting layer EL may proceed to a boundary surface I along the slope of the pixel defining layer PDL. Here, an incidence angle of the portion of the light at the boundary surface I may be equal to the angle θp. The angle θp may be greater than a critical angle θc determined by refractive indices of the first passivation layer f1 and the second passivation layer f2. Therefore, the incidence angle θp of the portion of the light at the boundary surface I may be greater than the critical angle θc, and the portion of the light may be totally reflected to the first passivation layer f1. That is, the pixel defining layer PDL may concentrate more light to the first passivation layer f1 by guiding emitted light to have an incidence angle greater than the critical angle θc. This can further improve the light-emission efficiency of the organic light-emitting layer EL.

Figure 8:
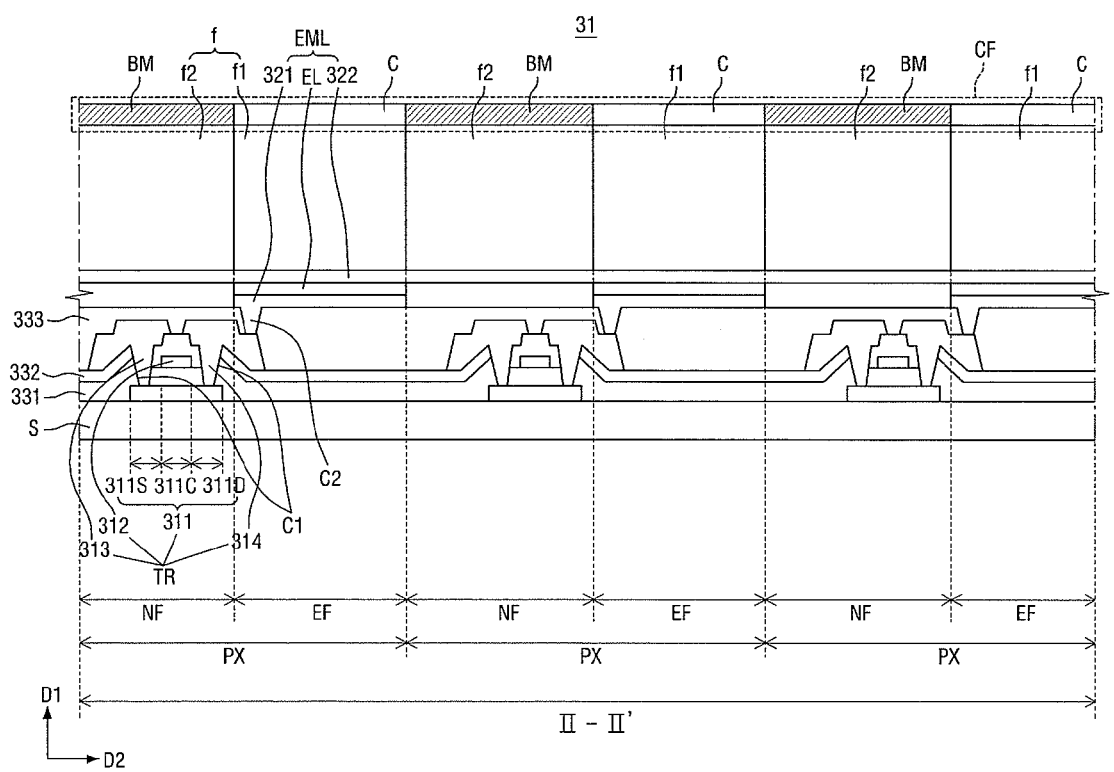
FIG. 8 is a cross-sectional view of a panel of an OLED display according to another embodiment.

FIG. 8 is a cross-sectional view of a panel 31 of an OLED display according to another embodiment.

Referring to FIG. 8, the panel 31 of the OLED display may further include a color filter CF formed on a passivation layer f. The color filter CF may include a filter layer C formed on a first passivation layer f1 and a black matrix BM formed on a second passivation layer f2. The filter layer C may correspond to each of emission regions EF, and the black matrix BM may correspond to each of non-emission regions NF.

The filter layer C may convert a color of light that passes through the filter layer C into a color of the filter layer C. The light may be white light w. The filter layer C may have any one of red, green and blue colors which are three primary colors of light. However, the described technology is not limited thereto. In some embodiments, the filter layer C may have any one of cyan, magenta and yellow which are complementary colors of red, green and blue. In some embodiments, the color filter CF may further include a transparent filter layer C that allows the white light w to pass therethrough without a change in order to improve its ability to express bright colors.

The black matrix BM may block light incident to the second passivation layer f2 from being emitted to the outside of the panel 31. That is, the black matrix BM can substantially prevent color mixture between pixels PX and define the filter layer C.

An organic light-emitting layer EL may emit the white light w upward, and the white light w may be converted into the color of the filter layer C as it passes through the filter layer C. As described above, a portion of emitted light may be totally reflected to the first passivation layer f1 at a boundary surface between the first passivation layer f1 and the second passivation layer f2. Therefore, it is possible to substantially prevent the diffusion of the portion of the light and concentrate the portion of the light to the first passivation f1, thereby improving light-emission efficiency. In addition, another portion of the emitted light may be refracted at the boundary surface between the first passivation layer f1 and the second passivation layer f2 to the black matrix BM formed on the second passivation layer f2. Therefore, the OLED display can substantially prevent color mixture between the pixels PX more effectively.

Other elements of the OLED display which are substantially the same as those of the OLED display 10 described above with reference to FIGS. 1 through 7 are identified by the same names and will not be described.

Figure 9:
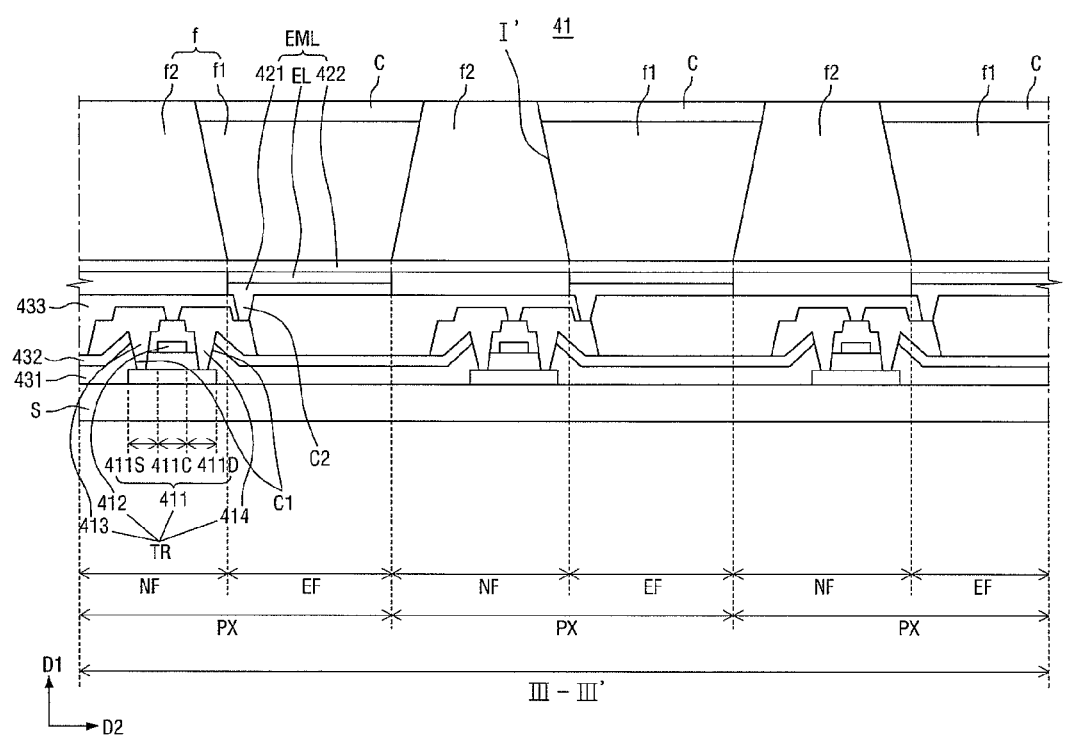
FIG. 9 is a cross-sectional view of a panel of an OLED display according to another embodiment.

FIG. 9 is a cross-sectional view of a panel 41 of an OLED display according to another embodiment.

Referring to FIG. 9, the panel 41 of the OLED display may further include a filter layer C formed on a first passivation layer f1. The filter layer C is substantially the same as the filter layer C of the OLED display of FIG. 8, and thus a description thereof will be omitted.

An organic light-emitting layer EL may emit white light w upward, and the white light w may be converted into a color of the filter layer C as it passes through the filter layer C.

A cross-sectional area of the first passivation layer f1 may increase from a bottom surface of the first passivation layer f1 toward a top surface thereof, and a boundary surface of the first passivation layer f1 with a second passivation layer f2 may be inclined. Here, the cross-sectional area of the bottom surface of the first passivation layer f1 may be substantially equal to a cross-sectional area of each of emission regions EF and a cross-sectional area of the organic light-emitting layer EL.

The inclined boundary surface may provide an incidence angle that causes most light to be totally reflected to the first passivation layer f1 and may minimize the amount of light sent to the second passivation layer f2. Therefore, since light can be concentrated to the first passivation layer f1, light-emission efficiency can be increased. In addition, since most of the light sent to the second passivation layer f2 can be blocked, color mixture between pixels PX can be substantially prevented. That is, even without a black matrix BM, the second passivation layer f2 stacked to a height substantially equal to a top surface of the filter layer C can define the filter layer C.

The OLED display according to the current embodiment can increase light-emission efficiency by concentrating emitted light to the first passivation layer f1 and can increase an aperture ratio by not including the black matrix BM.

Other elements of the OLED display which are substantially the same as those of the OLED display 10 described above with reference to FIGS. 1 through 7 are identified by the same names and will not be described.

A method of manufacturing the above OLED displays will hereinafter be described in detail.

Figure 10:
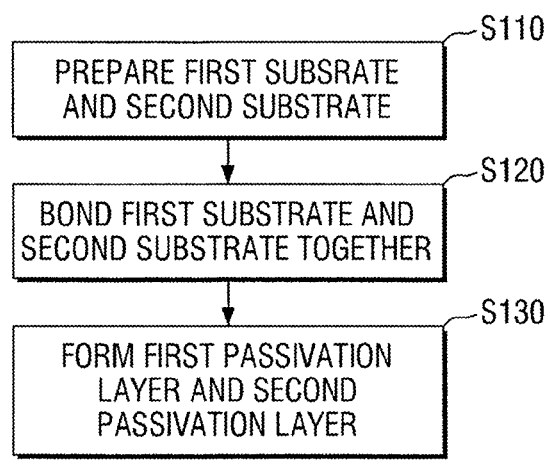
FIG. 10 is a flowchart illustrating a method of manufacturing an OLED display according to an embodiment.

FIG. 10 is a flowchart illustrating a method of manufacturing an OLED display according to an embodiment.

Referring to FIG. 10, the method of manufacturing the OLED display includes preparing a first substrate and a second substrate (operation S110), bonding the first substrate and the second substrate together (operation S120), and forming a first passivation layer and a second passivation layer (operation S130).

First, a first substrate S1 and a second substrate S2 are prepared (operation S110).

The first substrate S1 may be formed of an insulating material. In an example, the first substrate S1 may be formed of glass, quartz, ceramic or plastic. The first substrate S1 may support other elements placed thereon. The first substrate S1 may include non-emission regions NF and emission regions EF. In addition, the first substrate S1 may include a thin-film transistor TR formed on each of the non-emission regions NF and an OLED EML formed on each of the emission regions EF.

In the preparing of the first substrate S1, the thin-film transistor TR may be formed on each of the non-emission regions NF, and an organic light-emitting layer EL may be formed on each of the emission regions EF. The thin-film transistor TR may include a semiconductor layer 111, a gate electrode 112, a drain electrode 114 and a source electrode 113, and the OLED EML may include a first electrode 121, the organic light-emitting layer EL, and a second electrode 122. Here, the organic light-emitting layer EL may correspond to each of the emission regions EF. That is, a cross-sectional area of the organic light-emitting layer EL may be substantially equal to a cross-sectional area of each of the emission regions EF.

The above elements may be formed by a photolithography process using a photomask. The photolithography process may include a series of processes including exposing using an exposure device (not shown), developing, etching, and stripping or ashing.

In some embodiments, the preparing of the first substrate S1 may further include forming a buffer layer on the first substrate S1 to substantially prevent diffusion of impurity ions, substantially prevent penetration of moisture and outside air, and planarize the surface of the substrate S1.

The second substrate S2 may be an encapsulation substrate for sealing the first substrate S1. That is, the second substrate S1 may substantially prevent penetration of external impurities and moisture into the first substrate S1. The second substrate S2 may be a glass substrate or a plastic substrate formed of various plastic materials such as acrylic. In a top-emission OLED display, the second substrate S2 may be an electrically insulating material having high transmittance for light generated from the organic light-emitting layer EL. In an example, the second substrate S2 may include transparent glass (such as alkali glass or alkali-free gas), transparent ceramics (such as polyethylene terephthalate, polycarbonate, polyether sulfone, polyvinyl fluoride (PVF), polyacrylate or zirconia), or quartz.

Next, the first substrate S1 and the second substrate S2 are bonded together (operation S120). This will be described in detail with reference to FIG. 11.

Figure 11:
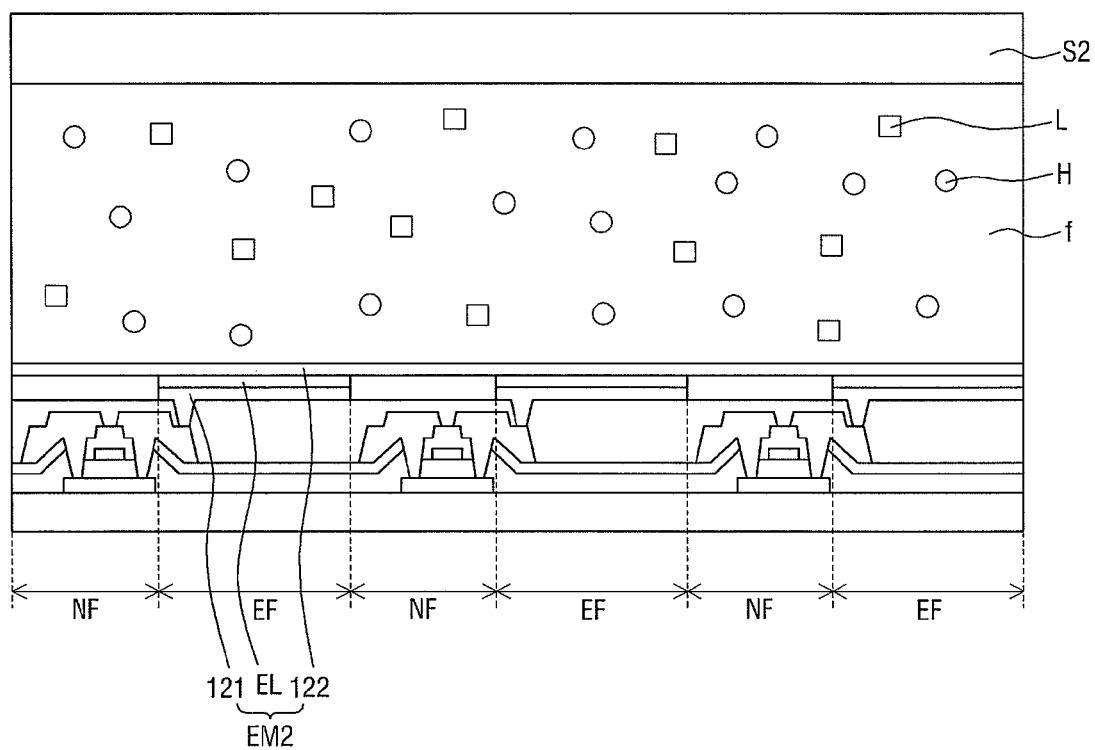
FIG. 11 is a cross-sectional view illustrating an operation of bonding a first substrate and a second substrate in the manufacturing method of FIG. 10.

FIG. 11 is a cross-sectional view illustrating the bonding of the first substrate and the second substrate (operation S120) in the manufacturing method of FIG. 10.

Referring to FIG. 11, filler f may be placed between the first substrate S1 and the second substrate S2, and then the first substrate S1 and the second substrate S2 may be bonded together. The first substrate S1 and the second substrate S2 may be bonded together by an encapsulant (not shown). The encapsulant (not shown) may be placed between the first substrate S1 and the second substrate S2. The encapsulant (not shown) may be frit which is gel-state glass obtained by adding organic matter to powder-state glass. The encapsulant may be cured with laser irradiation to solidify the encapsulant, thereby bonding the first substrate S1 and the second substrate S2 together.

The filler f may be placed in a space formed by the first substrate S1, the second substrate S2 and the encapsulant. Since the filler f fills the space as it is cured, it can protect devices formed on the first substrate S1 from external impact. The filler f may include a high refractive material H and a low refractive material L. That is, the filler f contains a mixture of the high refractive material H and the low refractive material L which are movable. The high refractive material H may include high refractive curable monomers such as polydiarylsiloxane, methyltrimethoxysilane or tetramethoxysilane. The low refractive material L may include ultraviolet-curable monomers such as ethylhexyl acrylate, pentafluoropropyl acrylate, poly(ethylene glycol) dimethacrylate, or ethylene glycol dimethacrylate. The high refractive material H may be cured to form a first passivation layer f1, and the low refractive material L may be cured to form a second passivation layer f2. The formation of the first passivation layer f1 and the second passivation layer f2 will be described below.

Finally, the first passivation layer f1 and the second passivation layer f2 are formed (operation S130). This will be described with reference to FIGS. 12 and 13.

Figure 12:
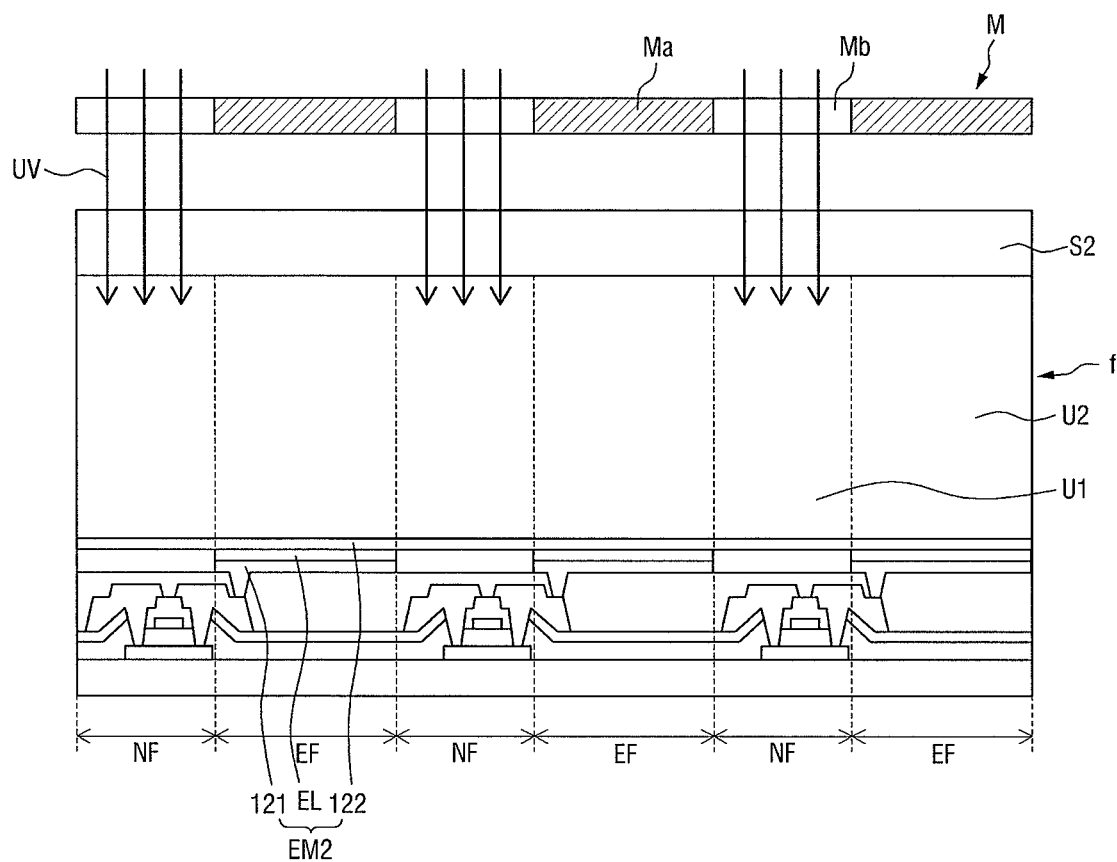
FIGS. 12 and 13 are cross-sectional views illustrating an operation of forming a first passivation layer and a second passivation layer in the manufacturing method of FIG. 10.
Figure 13:
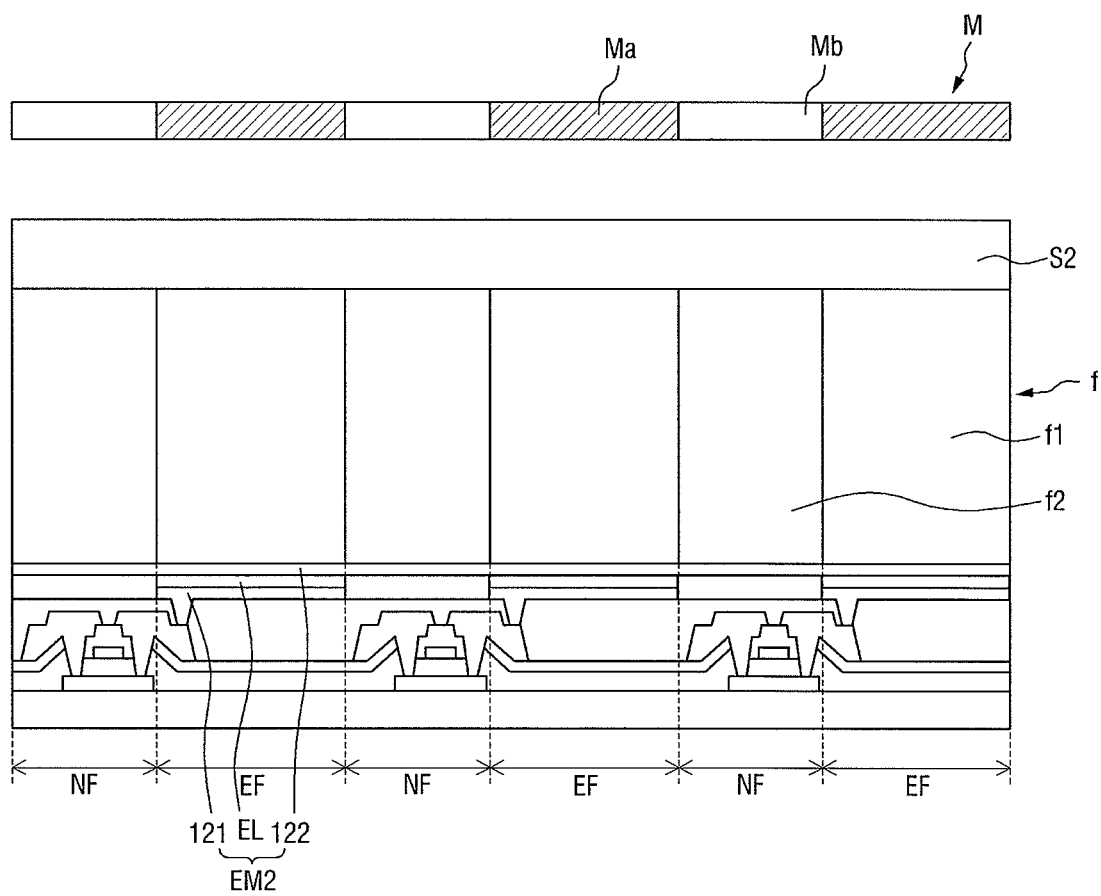

FIGS. 12 and 13 are cross-sectional views illustrating the forming of the first passivation layer f1 and the second passivation layer f2 (operation S130) in the manufacturing method of FIG. 10. The forming of the first passivation layer f1 and the second passivation layer f2 may be achieved by selective ultraviolet irradiation. Referring to FIG. 12, a mask may include light-transmitting portions Mb which transmit light 100% and light-blocking portions Ma which block light 100%, that is, have a light transmittance of 0%. A cross-sectional area of each of the light-transmitting portions Mb may be substantially equal to the cross-sectional area of each of the non-emission regions NF of the first substrate S1, and a cross-sectional area of each of the light-blocking portions Ma may be substantially equal to the cross-sectional area of each of the emission regions EF of the first substrate S1. Therefore, the cross-sectional area of each of the light-blocking portions Ma may be substantially equal to the cross-sectional area of the organic light-emitting layer EL. The mask M may be placed over the OLED display such that regions with substantially equal cross-sectional areas are aligned with each other.

Ultraviolet light UV may be irradiated toward the OLED display from above the mask M. The ultraviolet light UV may transmit through the light-transmitting portions Mb and the transparent second substrate S2 to reach the filler f. Accordingly, the ultraviolet light UV may be irradiated only to ultraviolet irradiation regions U1 of the filler f The ultraviolet irradiation regions U1 of the filler f may correspond not only to the light-transmitting portions Mb but also to the non-emission regions NF. Low refractive ultraviolet-curable monomers of the ultraviolet irradiation regions U1 may polymerize to form a low refractive ultraviolet-curable polymer. This polymerization may occur serially, and the high refractive material H may move to ultraviolet non-irradiation regions U2 as the above low refractive polymer occupies most of the ultraviolet irradiation regions U1. In addition, low refractive ultraviolet-curable monomers of the ultraviolet non-irradiation regions U2 may move to the ultraviolet irradiation regions U1 so as to participate in polymerization. Each of the ultraviolet irradiation regions U1 may become the second passivation layer f2 which is formed of a polymer of the low refractive material L. After the formation of the second passivation layer f2, each of the ultraviolet non-irradiation regions U2 may become the first passivation layer f1, which is formed of a high refractive material, through polymerization between the high refractive materials H. The first passivation layer f1 may be formed on each of the emission regions EF and substantially overlap the organic light-emitting layer EL.

That is, selective ultraviolet irradiation may result in the formation of the first passivation layer f1 which substantially overlaps the organic light-emitting layer EL and the second passivation layer f2 which does not overlap the organic light-emitting layer EL, as illustrated in FIG. 13. In the manufacturing method according to the current embodiment, the second passivation layer f2 is formed before the first passivation layer f1. However, the described technology is not limited thereto. In some embodiments, the first passivation layer f1 may be formed by selective ultraviolet irradiation, and then the second passivation layer f2 may be formed between the first passivation layers f1. In this case, the high refractive material H may be cured first.

The first passivation layer f1 may include a material having a refractive index of about 1.6 or more, and the second passivation layer f2 may include a material having a refractive index of less than about 1.6. That is, the refractive index of the first passivation layer f1 may be higher than the refractive index of the second passivation layer f2. Accordingly, since light emitted from the organic light-emitting layer EL can be concentrated to the emission regions EF as described above, it is possible to enhance light-emission efficiency and substantially prevent color mixture between pixels PX.

In some embodiments, the preparing of the second substrate S2 (operation S110) may further include forming a color filter CF on the second substrate S2. Here, the color filter CF may include a filter layer C which corresponds to each of the emission regions EF of the first substrate S1 and a black matrix BM which corresponds to each of the non-emission regions NF to define the filter layer C. In the forming of the first passivation layer f1 and the second passivation layer f2 (operation S130), selective ultraviolet irradiation can be performed using the color filter CF, not using a mask. That is, selective ultraviolet irradiation can be performed using the black matrix BM as each of the light-blocking portions Ma and the filter layer C as each of the light-transmitting portions Mb. In this case, the high refractive material H may be cured first to form the first passivation layer f1, and the low refractive material L may form the second passivation layer f2 between the first passivation layers f1. Since a cross-sectional area of the filter layer C is substantially equal to the cross-sectional area of each of the emission regions EF and the cross-sectional area of the organic light-emitting layer EL, the first passivation layer f1 may substantially overlap the organic light-emitting layer EL.

In some embodiments, the preparing of the second substrate S2 (operation S110) may further include forming a filter layer C on the second substrate S2 to correspond to each of the emission regions EF of the first substrate S1. In addition, the forming of the second passivation layer f2 (operation S130) may further include forming the second passivation layer f2 to a height equal to a top surface of the filter layer C such that the filter layer C can be defined by the second passivation layer f2.

Figure 14:
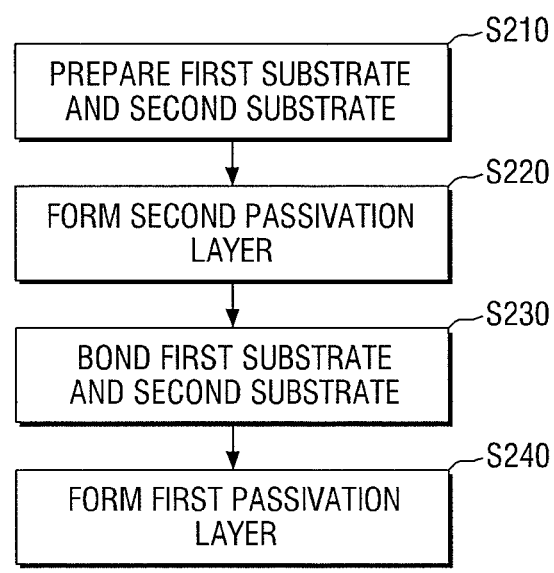
FIG. 14 is a flowchart illustrating a method of manufacturing an OLED display according to another embodiment.

FIG. 14 is a flowchart illustrating a method of manufacturing an OLED display according to another embodiment.

Referring to FIG. 14, the method of manufacturing the OLED display includes preparing a first substrate and a second substrate (operation S210), forming a second passivation layer (operation S220), bonding the first substrate and the second substrate together (operation S230), and forming a first passivation layer (operation S240).

First, the first substrate and the second substrate are prepared (operation S210). The preparing of the first substrate and the second substrate (operation S210) is substantially the same as the preparing of the first substrate and the second substrate (operation S110) in the manufacturing method according to the previous embodiment, and thus a detailed description thereof will be omitted.

Next, the second passivation layer is formed (operation S220). This will be described in detail with reference to FIG. 15.

Figure 15:
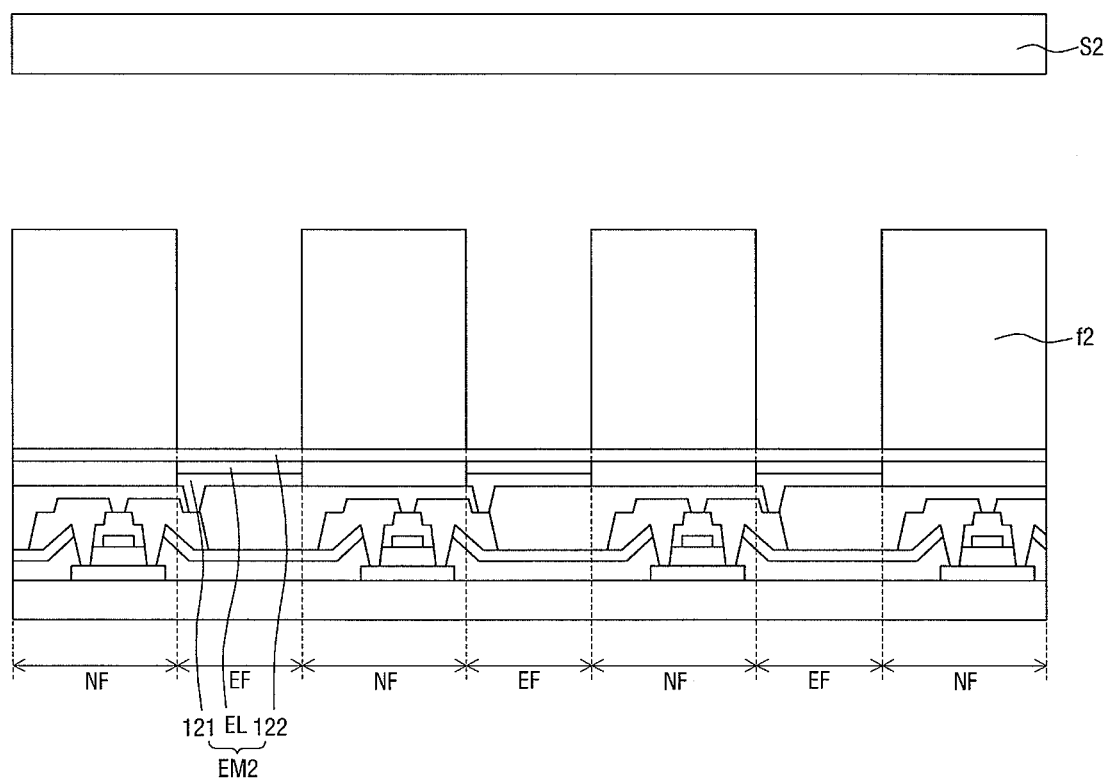
FIG. 15 is a cross-sectional view illustrating an operation of forming a second passivation layer in the manufacturing method of FIG. 14.

FIG. 15 is a cross-sectional view illustrating the forming of the second passivation layer (operation S220) in the manufacturing method of FIG. 14.

A second passivation layer f2 may be formed only on each of non-emission regions NF of a first substrate S1. The second passivation layer f2 may be formed on each of the non-emission regions NF by a lithography process using photoresist or a laser ablation process using laser beam irradiation. That is, the second passivation layer f2 may be spread over the whole surface of the first substrate S1 and then cured. In this state, regions of the second passivation layer f2 which correspond to the non-emission regions NF may be left unremoved, and the other regions of the second passivation layer f2 may be removed by anisotropic etching. Here, since the second passivation layer f2 is formed on each of the non-emission regions NF, it may not overlap an organic light-emitting layer EL formed on each of emission regions EF.

The second passivation layer f2 may include a material having a refractive index of less than about 1.6. The material having the refractive index of less than about 1.6 may be a low refractive ultraviolet-curable polymer such as ethylhexyl acrylate, pentafluoropropyl acrylate, poly(ethylene glycol)dimethacrylate or ethylene glycol dimethacrylate.

In the current embodiment, the second passivation layer f2 is formed on the first substrate S1 before a first passivation layer f1. However, the described technology is not limited thereto. In some embodiments, the first passivation layer f1 may be formed on the first substrate S1 before the second passivation layer f2, or the first passivation layer f1 and the second passivation layer f2 may be formed on a second substrate S2.

Next, the first substrate and the second substrate are bonded together (operation S230).

Filler may be spread on each of the emission regions EF of the first substrate S1. That is, the filler may be spread between the second passivation layers f2. The filler may include monomers of a high refractive material.

The first substrate S1 and the second substrate S2 may be bonded together with an encapsulant (not shown). The encapsulant (not shown) may be placed between the first substrate S1 and the second substrate S2. The encapsulant (not shown) may be frit which is gel-state glass obtained by adding organic matter to powder-state glass. The encapsulant may be cured with laser irradiation to solidify the encapsulant, thereby bonding the first substrate S1 and the second substrate S2 together.

Finally, the first passivation layer f1 is formed (operation S240). This will be described with reference to FIG. 16.

Figure 16:
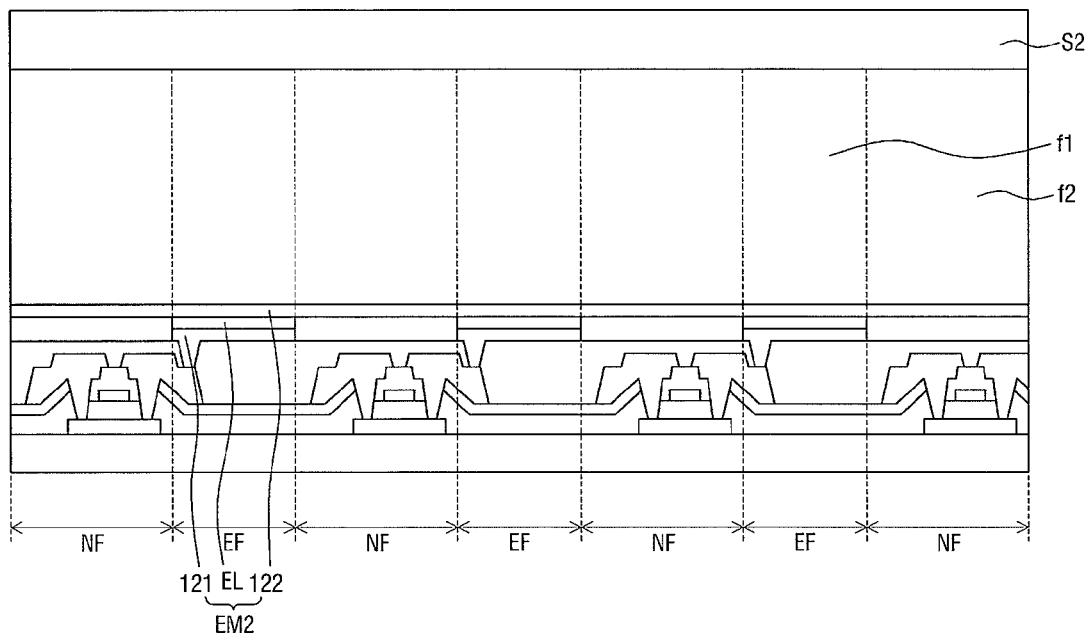
FIG. 16 is a cross-sectional view illustrating an operation of forming a first passivation layer in the manufacturing method of FIG. 14.

FIG. 16 is a cross-sectional view illustrating the forming of the first passivation layer (operation S240) in the manufacturing method of FIG. 14.

Referring to FIG. 16, the filler spread on each of the emission regions EF of the first substrate S1 may be cured to form the first passivation layer f1. That is, monomers of a high refractive material contained in the filler may be cured into a polymer, and the first passivation layer f1 including the high refractive polymer may be formed. The high refractive polymer may be a material having a refractive index of about 1.6 or more. The material having the high refractive index of about 1.6 or more may be high refractive curable polysilicon such as polydiaryl siloxane, methyltrimethoxysilane or tetramethoxysilane.

The first passivation layer f1 may be formed on each of the emission regions EF, and the second passivation layer f2 may be formed on each of the non-emission regions NF. The refractive index of the first passivation layer f1 may be higher than the refractive index of the second passivation layer f2. Accordingly, since light emitted from the organic light-emitting layer EL can be concentrated in the emission regions EF as described above, it is possible to enhance light-emission efficiency and substantially prevent color mixture between pixels.

In some embodiments, the preparing of the second substrate S2 (operation S210) may further include forming a color filter CF on the second substrate S2. Here, the color filter CF may include a filter layer C which corresponds to each of the emission regions EF of the first substrate S1 and a black matrix BM which corresponds to each of the non-emission regions NF to define the filter layer C.

In some embodiments, the preparing of the second substrate S2 (operation S210) may further include forming a filter layer C on the second substrate S2 to correspond to each of the emission regions EF of the first substrate S1. In addition, the forming of the second passivation layer f2 (operation S220) may further include forming the second passivation layer f2 to a height substantially equal to a top surface of the filter layer C such that the filter layer C can be defined by the second passivation layer f2.

Figure 17:
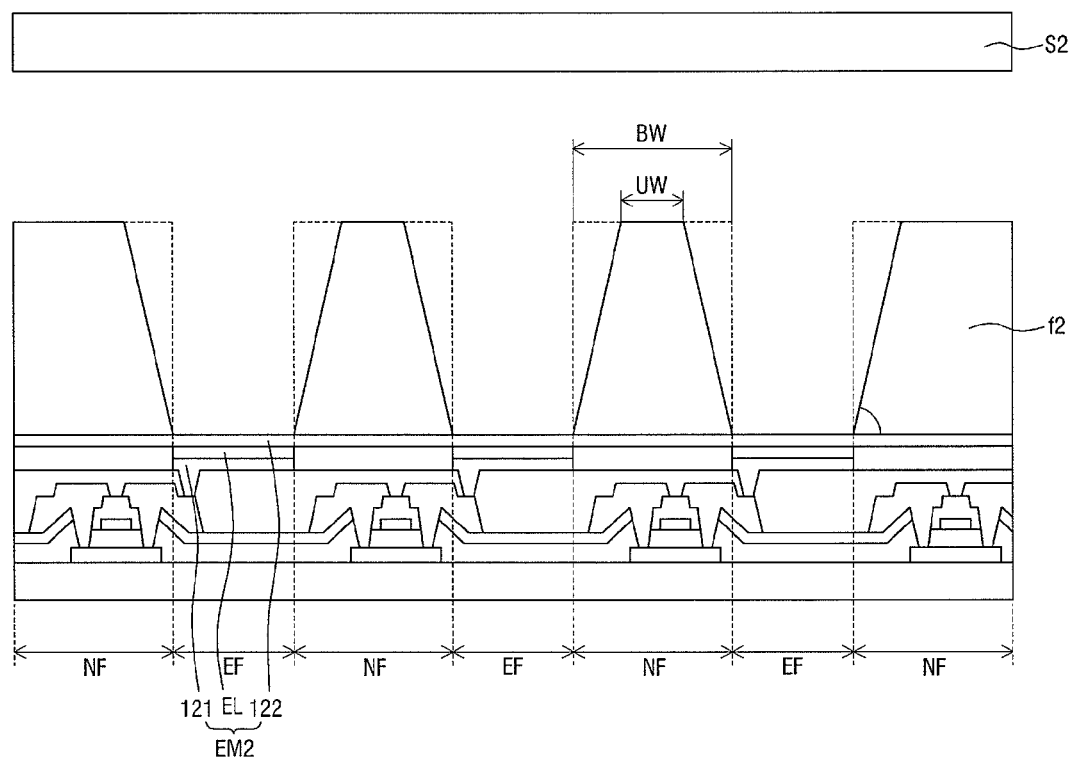
FIG. 17 is a cross-sectional view illustrating an operation of forming a second passivation layer in a method of manufacturing an OLED display according to another embodiment.

FIG. 17 is a cross-sectional view illustrating the forming of the second passivation layer in a method of manufacturing an OLED display according to another embodiment.

The forming of the second passivation layer in the manufacturing method according to the current embodiment may further include removing a region of a second passivation layer f2 to form an inclined boundary surface between a first passivation layer f1 and the second passivation layer f2 after forming the second passivation layer f2 to correspond to each of non-emission regions NF. The region of the second passivation layer f2 may be removed by, e.g., isotropic etching.

A cross-sectional area BW of a bottom surface of the second passivation layer f2 may be greater than a cross-sectional area UW of a top surface of the second passivation layer f2. Here, the bottom surface may be a surface of the second passivation layer f2 which contacts a first substrate S1. Therefore, a cross-sectional area of the second passivation layer f2 may decrease from the bottom surface of the second passivation layer f2 toward the top surface thereof. The inclined boundary surface may cause more light to have an incidence angle greater than a critical angle, compared with a vertical boundary surface. That is, light having an incidence angle greater than a critical angle θc may enter the boundary surface and then be totally reflected to the first passivation layer f1 which corresponds to each of emission regions EF. Accordingly, the amount of light that is sent to the second passivation layer f2 can be minimized, and more light can be concentrated to the emission regions EF. This can further improve light-emission efficiency.

According to some embodiments, at least one of the following advantages may be provided.

Light-emission efficiency of an OLED display can be improved.

In addition, it is possible to substantially prevent color mixture between pixels.

However, the effects of the described technology are not restricted to those set forth herein. The above and other effects of the described technology will become more apparent to one of ordinary skill in the art to which the described technology pertains by referencing the accompanying claims.

While the described technology has been particularly shown and described with reference to exemplary embodiments thereof, it will be understood by those of ordinary skill in the art that various changes in form and details may be made therein without departing from the spirit and scope of the described technology as defined by the following claims. It is therefore desired that the described embodiments be considered in all respects as illustrative and not restrictive, reference being made to the appended claims rather than the foregoing description to indicate the scope of the invention.

What is claimed is:

1. A method of manufacturing an organic light-emitting diode (OLED) display, the method comprising:
providing a first substrate comprising an organic light-emitting layer;
providing a second substrate which substantially seals the first substrate;
placing filler between the first and second substrates;
bonding the first and second substrates; and
forming i) a first passivation layer to substantially overlap the organic light-emitting layer and ii) a second passivation layer, wherein the second passivation layer does not overlap the organic light-emitting layer,
wherein the first and second passivation layers have first and second refractive indexes, respectively, and wherein the first refractive index is greater than the second refractive index.

2. The method of claim 1, wherein the filler comprises a high refractive material and a low refractive material, and the forming comprises i) curing the low refractive material with ultraviolet radiation to form the second passivation layer, and ii) curing the high refractive material between the second passivation layer and another second passivation layer to form the first passivation layer.

3. The method of claim 2, wherein the first refractive index is greater than about 1.6, and wherein the second refractive index is less than about 1.6.

4. The method of claim 1, wherein the providing of the second substrate comprises forming a color filter over the second substrate, wherein the color filter comprises a filter layer corresponding to the first passivation layer and a black matrix corresponding to the second passivation layer to define the filter layer.

5. The method of claim 1, wherein the providing of the second substrate comprises forming a filter layer over the second substrate to correspond to the first passivation layer, and wherein the filter layer is defined by the second passivation layer.

6. A method of manufacturing an organic light-emitting diode (OLED) display, the method comprising: providing a first substrate comprising an organic light-emitting layer; providing a second substrate to substantially seal the first substrate; forming a second passivation layer over the first substrate, wherein the second passivation layer does not overlap the organic light-emitting layer, placing a filler between the second passivation layer and another second passivation layer and bonding the first and second substrates; and curing the filler to form a first passivation layer, wherein the first and second passivation layers have first and second refractive indexes, respectively, and wherein the first refractive index is greater than the second refractive index.

7. The method of claim 6, wherein the first refractive index is greater than about 1.6, and wherein the second refractive index is less than about 1.6.

8. The method of claim 7, wherein the first passivation layer is formed at least of a high refractive curable polysilicon, and wherein the second passivation layer is formed at least of a low refractive ultraviolet-curable polymer.

9. The method of claim 6, wherein a cross-sectional area of a bottom surface of the second passivation layer is greater than a cross-sectional area of a top surface of the second passivation layer.

10. The method of claim 9, wherein a cross-sectional area of the second passivation layer decreases from the bottom surface toward the top surface.

11. The method of claim 6, wherein the providing of the second substrate comprises forming a color filter over the second substrate, and wherein the color filter comprises a filter layer corresponding to the first passivation layer and a black matrix corresponding to the second passivation layer to define the filter layer.

12. The method of claim 6, wherein the providing of the second substrate comprises forming a filter layer over the second substrate to correspond to the first passivation layer, and wherein the filter layer is defined by the second passivation layer.

* * * * *